(12) United States Patent
Kim et al.

(10) Patent No.: US 9,674,944 B2
(45) Date of Patent: Jun. 6, 2017

(54) PRINTED CIRCUIT BOARD AND MANUFACTURING METHOD THEREOF

(71) Applicant: SAMSUNG ELECTRO-MECHANICS CO., LTD., Suwon-Si (KR)

(72) Inventors: Byung-Moon Kim, Busan (KR); Ho-Sik Park, Hwaseong-si (KR); Dong-Keun Lee, Seoul (KR); Sung-Jun Lee, Busan (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

(21) Appl. No.: 15/157,627

(22) Filed: May 18, 2016

(65) Prior Publication Data

US 2017/0006700 A1 Jan. 5, 2017

(30) Foreign Application Priority Data

Jul. 1, 2015 (KR) .......................... 10-2015-0094364

(51) Int. Cl.
| | |
|---|---|
| H05K 1/02 | (2006.01) |
| H05K 3/10 | (2006.01) |
| H05K 3/00 | (2006.01) |
| H05K 3/40 | (2006.01) |
| H05K 1/03 | (2006.01) |
| H05K 3/46 | (2006.01) |

(52) U.S. Cl.
CPC ......... *H05K 1/0271* (2013.01); *H05K 1/0306* (2013.01); *H05K 1/0313* (2013.01); *H05K 1/0366* (2013.01); *H05K 3/0011* (2013.01); *H05K 3/10* (2013.01); *H05K 3/4038* (2013.01); *H05K 3/4611* (2013.01); *H05K 2201/0175* (2013.01)

(58) Field of Classification Search
CPC .. H05K 1/0271; H05K 1/0306; H05K 1/0313; H05K 1/0366; H05K 3/6411; H05K 3/0011; H05K 3/4038; H05K 3/10
USPC ....................................................... 174/258
See application file for complete search history.

(56) References Cited

U.S. PATENT DOCUMENTS

2002/0180027 A1* 12/2002 Yamaguchi ........... H01L 21/486
257/700

FOREIGN PATENT DOCUMENTS

| JP | 2014-22465 A | 2/2014 |
|---|---|---|
| JP | 2014-127701 A | 7/2014 |

* cited by examiner

*Primary Examiner* — Timothy Thompson
*Assistant Examiner* — Charles Pizzuto
(74) *Attorney, Agent, or Firm* — NSIP Law

(57) ABSTRACT

A printed circuit board and a method of manufacturing the same are provided. A printed circuit board having conductive patterns formed in multilayers on an insulating material laminated on both surfaces of a glass core is provided. The printed circuit board includes a first insulating material disposed on a first surface and a second surface of the glass core, and a second insulating material disposed on the first insulating material. The first insulating material surrounds a first portion of a side surface of the glass core and the second insulating material surrounds a second portion of the side surface of the glass core, the second portion being a portion of the glass core not surrounded by the first insulating material.

17 Claims, 9 Drawing Sheets

A-A'

I-I'

I-I'

I-I'

I-I'

I-I'

I-I'

PRINTED CIRCUIT BOARD AND MANUFACTURING METHOD THEREOF

CROSS REFERENCE TO RELATED APPLICATION

This application claims the benefit under 35 U.S.C. §119(a) of Korean Patent Application No. 10-2015-0094364 filed on Jul. 1, 2015 in the Korean Intellectual Property Office, the entire disclosure of which is incorporated herein by reference for all purposes.

BACKGROUND

1. Field

The following description relates to a printed circuit board and a manufacturing method thereof.

2. Description of Related Art

As a printed circuit board becomes thinner and thinner, issues associated with warpage and/or cracks increase during a process for manufacturing a printed circuit board. A glass core structure has been introduced to prevent or eliminate such issues in which a glass plate is formed in a core part of a printed circuit board.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

According to one general aspect, a printed circuit board having conductive patterns formed in multilayers on an insulating material laminated on both surfaces of a glass core is provided. The printed circuit board includes a first insulating material disposed on a first surface and a second surface of the glass core. and a second insulating material disposed on the first insulating material. The first insulating material surrounds a first portion of a side surface of the glass core and the second insulating material surrounds a second portion of the side surface of the glass core, the second portion being a portion of the glass core not surrounded by the first insulating material.

The glass core may be disposed inside the first insulating material and the second insulating material, such that no portion of the glass core is exposed to the outside.

The first insulating material surrounding the side surface of the glass core may be integrated with the first insulating material disposed on the first surface and the second surface of the glass core.

The second insulating material may be integrated with the second insulating material disposed on the first insulating material.

The first insulating material and the second insulating material may include a resin. The first insulating material and the second insulating material may further include a reinforcing material. The first insulating material may be different from the second insulating material.

The printed circuit board may further include a conductive pattern disposed on the first insulating material.

In another general aspect a method of manufacturing a printed circuit board is provided. The method includes forming a first hole along a part of boundaries between unit printed circuit boards having a glass core, laminating a first insulating material on a first surface and a second surface of the glass core and filling the first hole with the first insulating material, forming a second hole at a portion where the first hole is not formed in the boundaries between the unit printed circuit boards, laminating a second insulating material on the first insulating material and filling the second hole with the second insulating material, and cutting a portion where the first insulating material and the second insulating material are formed along the boundaries to form unit printed circuit boards.

The glass core of each of the unit printed circuit board may be formed inside the first insulating material and the second insulating material, such that no portion of the glass core is exposed to the outside.

The first insulating material filled in the first hole may be integrated with the first insulating material laminated on the first surface and the second surface of the glass core.

The second insulating material filled in the second hole may be integrated with the second insulating material laminated on the first insulating material.

The first insulating material and the second insulating material may include a resin. The first insulating material and the second insulating material may further include a reinforcing material.

The first insulating material may be different from the second insulating material.

The method may further include forming a conductive pattern on each of the first insulating material and the second insulating material. The method may further include forming a conducting via passing through the glass core, the first insulating material, and the second insulating material, the conducting via connecting the conductive pattern on the first insulating layer with the conductive pattern on the second insulating layer.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
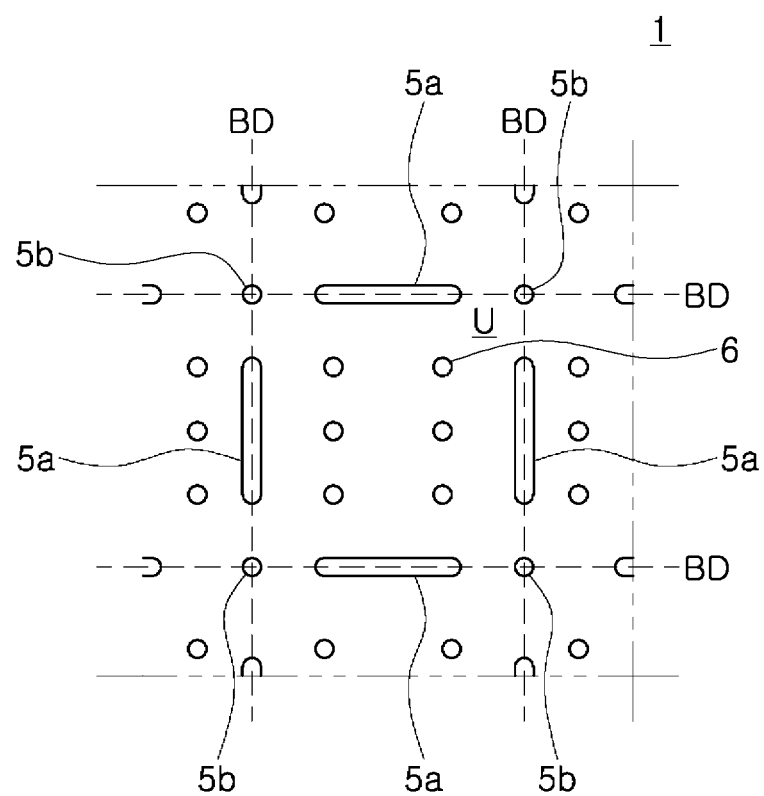
FIG. 1 is a diagram illustrating a glass core of an existing printed circuit board.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

The terms used in the description are intended to describe certain embodiments only, and shall by no means restrict the present disclosure. Unless clearly used otherwise, expressions in the singular number include a plural meaning.

In the present description, an expression such as "comprising" or "consisting of" is intended to designate a characteristic, a number, a step, an operation, an element, a part or combinations thereof, and shall not be construed to preclude any presence or possibility of one or more other characteristics, numbers, steps, operations, elements, parts or combinations thereof.

The terminology used herein is for the purpose of describing particular examples only, and is not intended to limit the scope of the disclosure in any way. As used herein, the singular forms "a," "an," and "the" are intended to include the plural forms as well, unless the context clearly indicates otherwise. It will be further understood that the terms "include" and/or "have," when used in this specification, specify the presence of stated features, numbers, operations, elements, components, or combinations thereof, but do not preclude the presence or addition of one or more other features, numbers, operations, elements, components or combinations thereof.

Unless indicated otherwise, a statement that a first layer is "on" a second layer or a substrate is to be interpreted as covering both a case where the first layer directly contacts the second layer or the substrate, and a case where one or more other layers are disposed between the first layer and the second layer or the substrate.

It will be understood that, although the terms "first," "second," "third," "fourth" etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. Similarly, when it is described that a method includes series of steps, a sequence of the steps is not a sequence in which the steps should be performed in the sequence, an arbitrary technical step may be omitted and/or another arbitrary step, which is not disclosed herein, may be added to the method.

The terms used herein may be exchangeable to be operated in different directions than shown and described herein under an appropriate environment. It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Words describing relative spatial relationships, such as "below", "beneath", "under", "lower", "bottom", "above", "over", "upper", "top", "left", and "right", may be used to conveniently describe spatial relationships of one device or elements with other devices or elements. Such words are to be interpreted as encompassing a device oriented as illustrated in the drawings, and in other orientations in use or operation. For example, an example in which a device includes a second layer disposed above a first layer based on the orientation of the device illustrated in the drawings also encompasses the device when the device is flipped upside down in use or operation.

Unless otherwise defined, all terms, including technical and scientific terms, used herein have the same meaning as commonly understood by one of ordinary skill in the art to which this description pertains. It will be further understood that terms, such as those defined in commonly used dictionaries, should be interpreted as having a meaning that is consistent with their meaning in the context of the relevant art and are not to be interpreted in an idealized or overly formal sense unless expressly so defined herein.

Hereinafter, certain embodiments of the present disclosure will be described in detail with reference to the accompanying drawings.

Printed Circuit Board and Manufacturing Method Thereof

FIG. 1 is a diagram illustrating a glass core of an existing printed circuit board.

As a printed circuit board becomes thinner and thinner, issues associated with warpage and/or torsion arise during manufacturing the printed circuit board. When a glass core having high rigidity and low coefficient of thermal expansion is used in a core, such warpage issues can be reduced.

However, cracks may result when the glass core is cut into unit printed circuit boards. Moreover, due to the fragile nature of glass defect rate may increase when any impact is applied to the glass core.

As shown in FIG. 1, boundaries BD between unit printed circuit boards U having a glass core 1 are partially eliminated by providing trenches 5a and/or holes 5b filled with a resin insulating material. The unit printed circuit boards U are cut along the boundaries BD. Here, the glass core 1 is not cut at the portions where the resin insulating material is filled into the trenches 5a and/or the holes 5b in the cutting process so that the incidence of cracks in the glass core 1 may be reduced.

However, when the boundaries BD are cut where the trenches 5a and/or the holes 5b are not formed, the glass core 1 may be still damaged because such portions of the boundaries BD include portions of the glass core 1. Moreover, because the glass core is exposed to the side surface, it causes toast defects in the board.

Furthermore, if all boundaries BD of the glass core 1 are eliminated, the unit printed circuit boards U become separated from each other. Thus, the boundaries BD cannot be eliminated completely.

A printed circuit board according to an example includes a first insulating material and a second insulating material laminated in order. The first insulating material surrounds a part of a side surface of a glass core and the second insulating material surrounds the rest the side surface which is not surrounded by the first insulating material so that the glass core can be mounted inside the first insulating material, and the glass core is not exposed to the outside.

Thus, the printed circuit board according to an example may not cause cracks when unit printed circuit boards are cut because the glass core is not cut, and may further remove toast defects between boards because the side surface of the glass core is not exposed to the outside.

Figure 2:
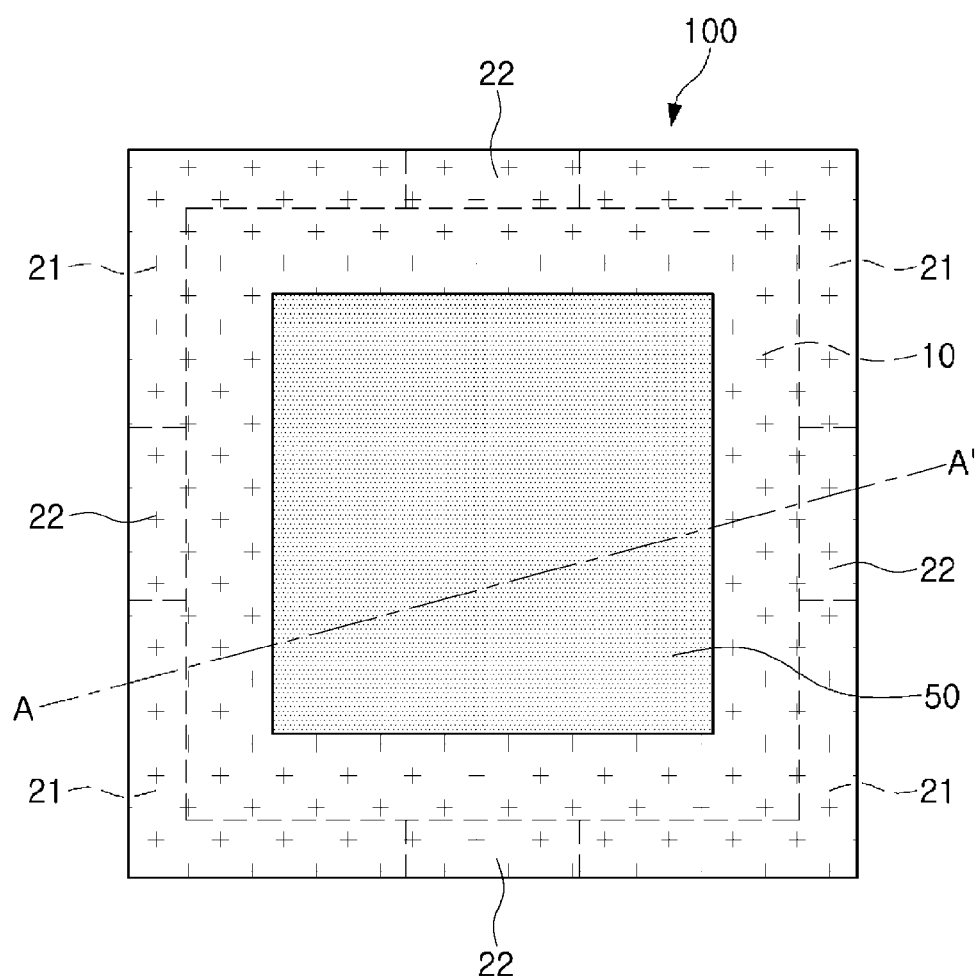
FIG. 2 is a diagram illustrating an example of a printed circuit board, in accordance with an embodiment.
Figure 3:
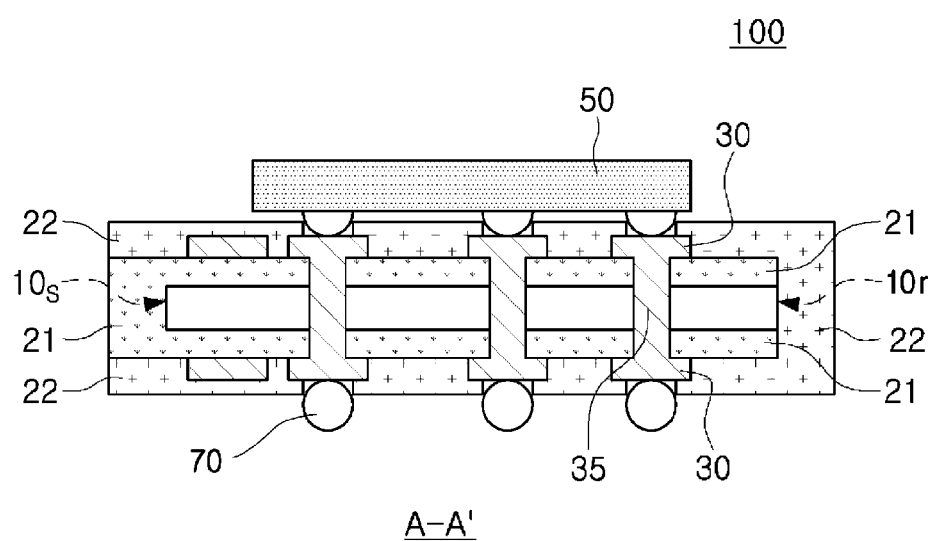
FIG. 3 is a diagram illustrating a cross-section of the printed circuit board of FIG. 2 across the A-A' line.

FIG. 2 is a diagram illustrating an example of a printed circuit board and FIG. 3 is a diagram illustrating a cross-section of the printed circuit board of FIG. 2 across the A-A' line.

Referring to FIG. 2 and FIG. 3, a printed circuit board 100 according to an example includes a glass core 10, a first insulating material 21 disposed on a first surface and a second surface of the glass core 10, and a second insulating material 22 disposed on the first insulating material 21. Conductive patterns 30 are disposed on the first insulating material 21 and the second insulating material 22 in multilayers. The conductive pattern 30 disposed in multilayers may be connected through a via 35 which passes through the glass core 10 and the insulating material 21.

A pad (not explicitly shown) for mounting an electronic component (e.g., semiconductor chip 50) and a pad (not explicitly shown) for an external connection terminal may be exposed among the conductive patterns 30 disposed on the outmost layer insulating material 22. A solder bump 70 may be formed on the exposed pad for mounting an electronic component and an electronic component (e.g., semiconductor chip 50) may be mounted on the solder bump 70.

A part of the side surface 10s of the glass core 10 of the printed circuit board 100 may be surrounded by the first insulating material 21 and the rest side surface 10r of the glass core 10 which is not surrounded by the first insulating material 21 may be surrounded by the second insulating material 22. That is, the upper surface, the lower surface and the side surface of the glass core 10 may be completely surrounded by the first insulating material 21 and the second insulating material 22, such that no portion of the glass core 10 is exposed to the outside.

Accordingly, the printed circuit board according to an example may prevent the breakage of the glass core 10 when unit printed circuit boards are cut because the glass core 10 is not directly cut. The printed circuit board may further prevent a toast defect between boards because the glass core 10 is not exposed to the outside.

Examples of the glass core 10 may include, for example, a pure silicon dioxide (about 100% $SiO_2$), a soda-lime glass, a borosilicate glass, an aluminosilicate glass (alumino-silicate glass) or any combination thereof. It may not be limited to silicon-based glass compositions. For example, the glass core 10 may be, for example, a fluoride glass, a phosphate glass, a chalcogenide glass, or any combination thereof. The printed circuit board may further include additives to provide a glass having specific physical properties if needed. Examples of the additive include, without limitation, calcium carbonate (e.g., lime) and sodium carbonate (e.g., sodium), magnesium, calcium, manganese, aluminum, lead, boron, iron, chromium, calcium, sulfur and antimony, carbonates and/or oxides of such atoms.

The first insulating material 21 and the second insulating material 22 may include a thermosetting resin such as, for example, an epoxy resin and a thermoplastic resin such as, for example, polyimide. The first insulating material 21 and the second insulating material 22 may further include a reinforcing material. Examples of the reinforcing material may include, without limitation, a fabric reinforcing material, an inorganic filler, or any combination thereof. The fabric reinforcing material may be, for example, glass fiber and a prepreg (PPG) may be formed, for example, by incorporating the glass fiber into the resin.

The first insulating material 21 and the second insulating material 22 may be the same as or different from each other. As used herein, different insulating material means different types of materials composing the insulating material, different types of reinforcing materials, and/or different compositions.

The conductive pattern 30 may be formed of any conductive metal without limitation, for example, copper (Cu), silver (Ag), gold (Au), platinum (Pt), nickel (Ni), or any combination thereof. The via 35 may be formed of the same material used for the conductive pattern 30. However, it may not be limited thereto. The via 35 may be formed of any conductive metal.

The first insulating material 21 surrounding the side surface 10s of the glass core 10 may be integrated with the first insulating material 21 laminated on the first surface and the second surface of the glass core 10.

Because the first insulating material 21 is laminated on the first surface and the second surface of the glass core 10 and the hole formed in the glass core 10 is also filled with the first insulating material 21, the first insulating material 21 surrounding the side surface 10s of the glass core 10 can be integrated with the first insulating material 21 laminated on the first surface and the second surface of the glass core 10.

The second insulating material 22 surrounding the side surface 10r of the glass core 10 may be integrated with the second insulating material 22 laminated on the first insulating material 21.

As illustrated in FIGS. 2 and 3 the first insulating material 21 and the second insulating material 22 are laminated on both surfaces of the glass core 10, but it may not limited thereto. For example, the insulating materials may be further laminated on one surface of the glass core 10 in 2 or more layers.

FIGS. 4A to 9A are sectional diagrams illustrating a printed circuit board during various operations of a method of manufacturing a printed circuit board in accordance with an embodiment. FIGS. 4B to 9B are diagrams illustrating corresponding cross-sections of the printed circuit board of across the I-I' line in the corresponding sectional diagram.

Figure 4A:
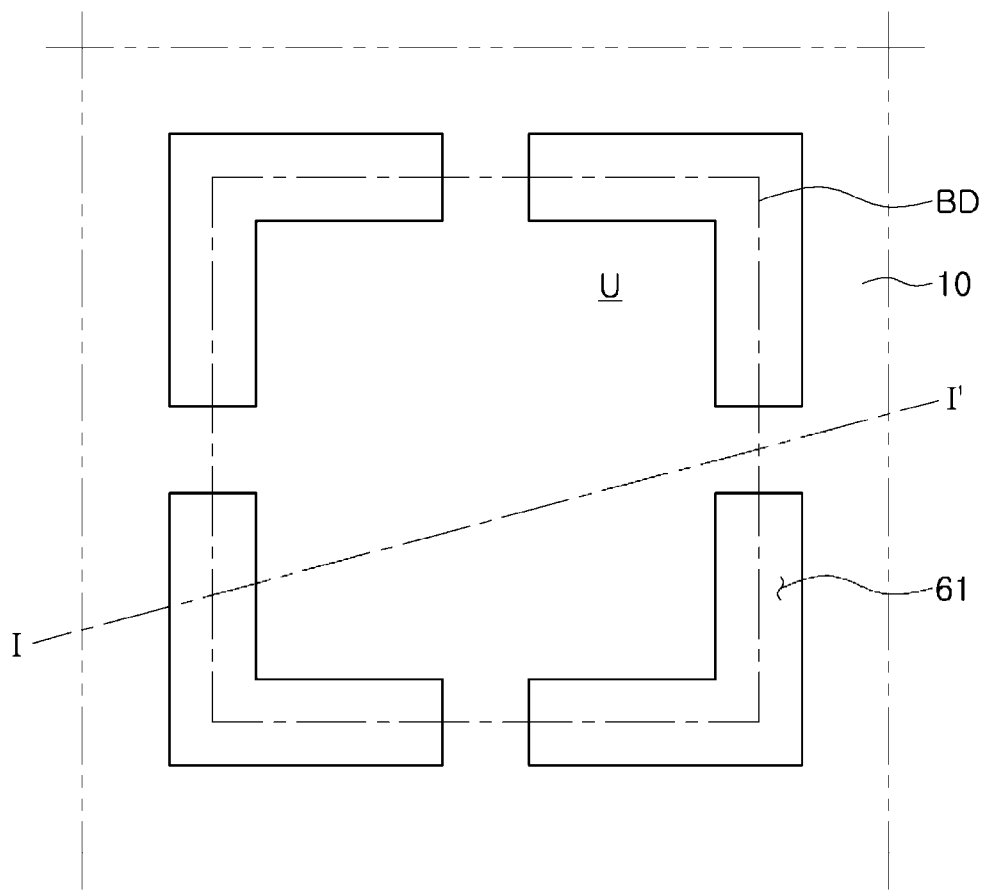
FIG. 4A a sectional diagram illustrating a printed circuit board during an operation of a method of manufacturing a printed circuit board, in accordance with an embodiment.
Figure 4B:
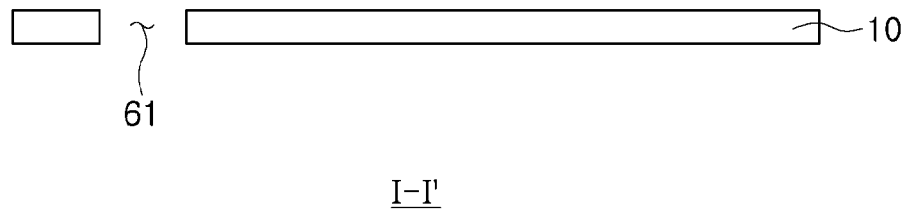
FIG. 4B is a diagram illustrating a cross-section of the printed circuit board of FIG. 4A across the I-I' line.

Referring to FIGS. 4A and 4B, a plurality of unit printed circuit boards U may be formed on the glass core 10. Boundaries BD may be formed board between the unit printed circuit boards U to enable cutting the glass core 10 into the unit printed circuit boards. A first hole 61 is formed along a part of the boundaries BD between the unit printed circuit boards U.

The first hole 61 may be formed using a suitable method such as, for example, mechanical drilling, or laser drilling. However, it may not be limited thereto.

While the first hole 61 is illustrated to be an elongated trench shape in FIG. 4A, the shape of the first hole 61 may not be limited thereto. The first hole 61 is formed to pass through from the first surface of the glass core 10 to the second surface.

The first hole 61 is formed along a part of the boundaries BD between the unit printed circuit boards U because forming the hole along the entire boundaries BD would result in separation of each unit printed circuit board U from each other.

Figure 5A:
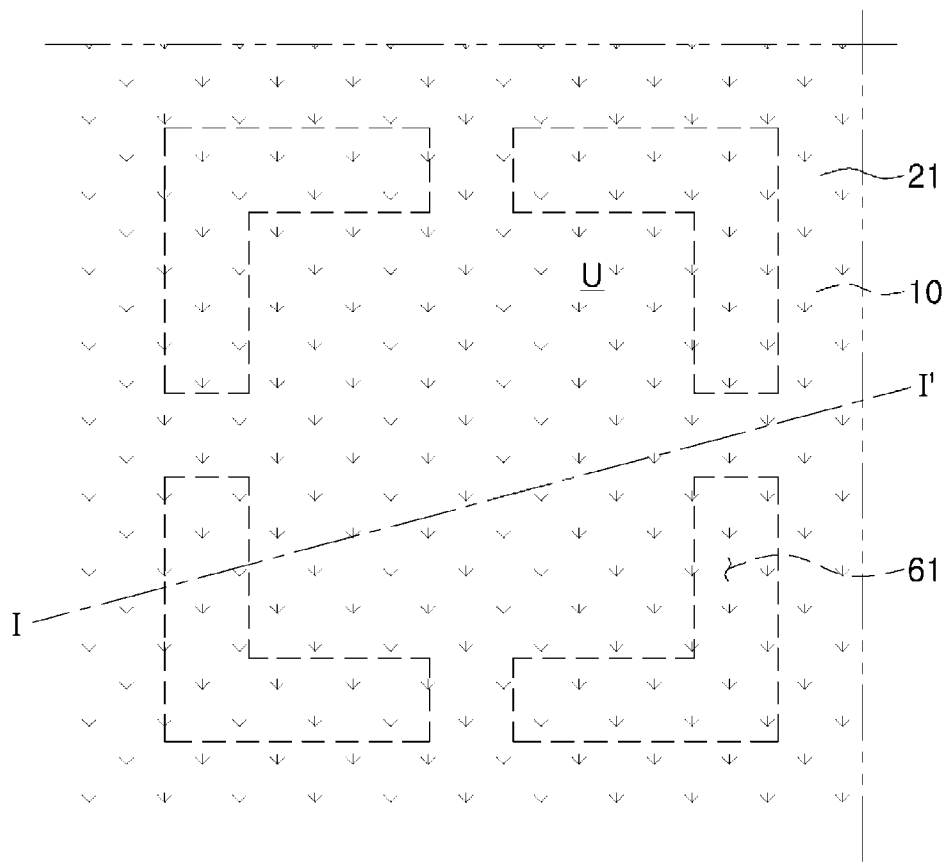
FIG. 5A a sectional diagram illustrating a printed circuit board during an operation of a method of manufacturing a printed circuit board, in accordance with an embodiment.
Figure 5B:
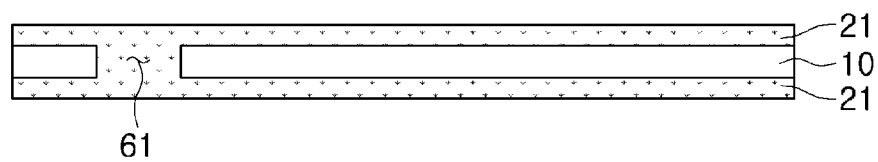
FIG. 5B is a diagram illustrating a cross-section of the printed circuit board of FIG. 5A across the I-I' line.

Referring to FIGS. 5A and 5B, the first insulating material 21 is formed on a first surface and a second surface of the glass core 10. The first hole 61 is filled with the first insulating material 21.

Because the first insulating material 21 is laminated on the first surface and the second surface of the glass core 10, and the hole 61 formed in the glass core 10 is also filled with the first insulating material 21, the first insulating material 21 filled into the first hole 61 may be integrated with the first insulating material 21 laminated on the first surface and the second surface of the glass core 10.

Figure 6A:
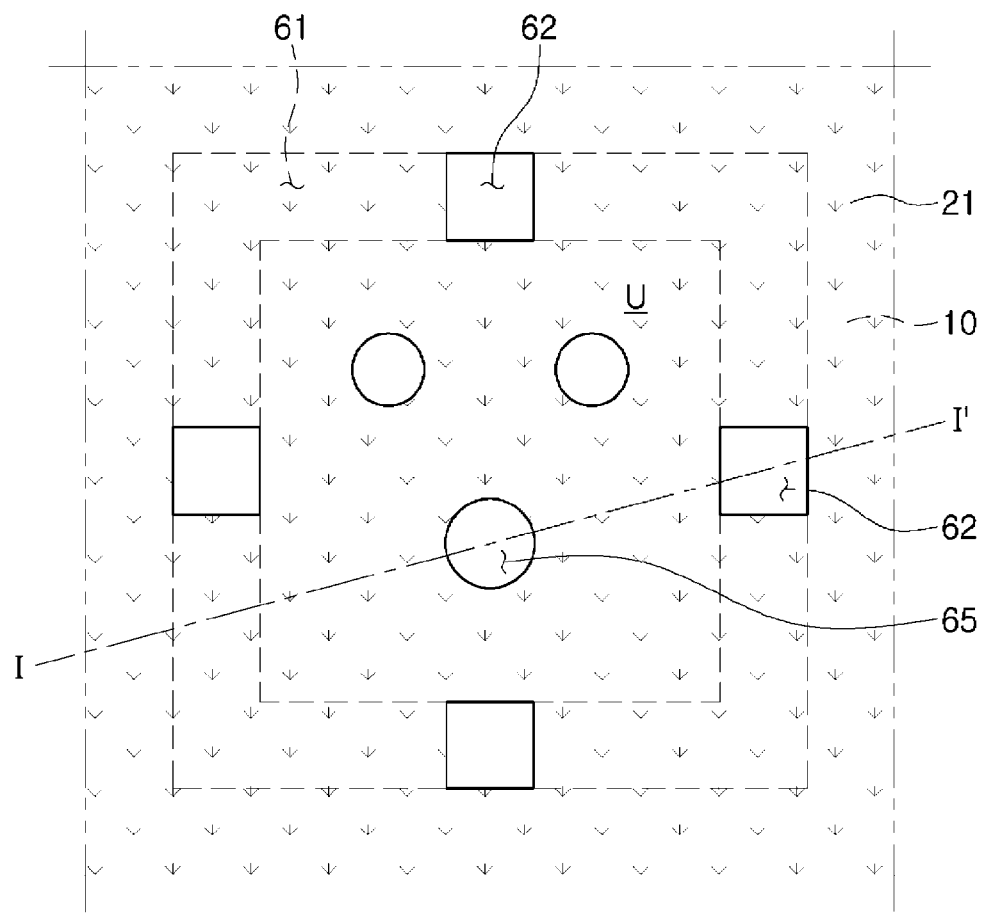
FIG. 6A a sectional diagram illustrating a printed circuit board during an operation of a method of manufacturing a printed circuit board, in accordance with an embodiment.
Figure 6B:
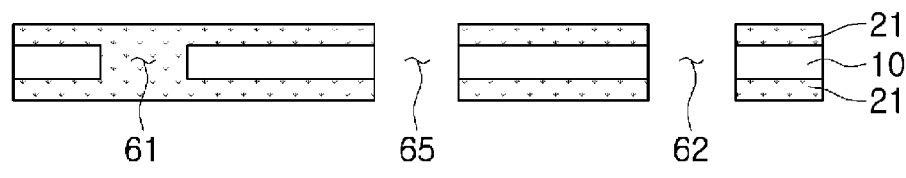
FIG. 6B is a diagram illustrating a cross-section of the printed circuit board of FIG. 6A across the I-I' line.

Referring to FIGS. 6A and 6B, a second hole 62 is formed at the portion of the boundaries BD between the unit printed circuit boards U where the first hole 61 is not formed.

The second hole 62 may be formed using a suitable method such as, for example, mechanical drilling, or laser drilling. However, it may not be limited thereto.

By forming the second hole 62 at the portion of the boundaries BD where the first hole 61 is not formed, all glass in the boundaries BD is completely removed.

A via hole 65 may be also formed while forming the second hole 62 using the same method, or a different method.

Figure 7A:
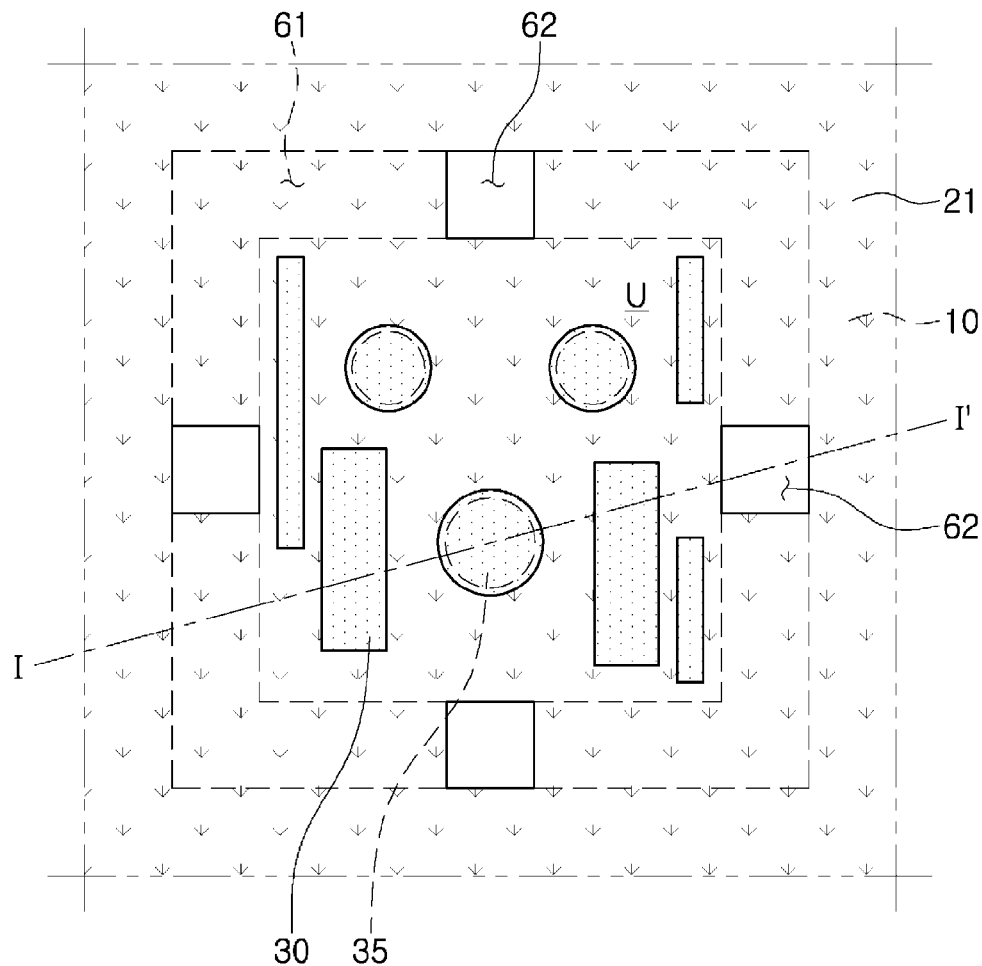
FIG. 7A a sectional diagram illustrating a printed circuit board during an operation of a method of manufacturing a printed circuit board, in accordance with an embodiment.
Figure 7B:
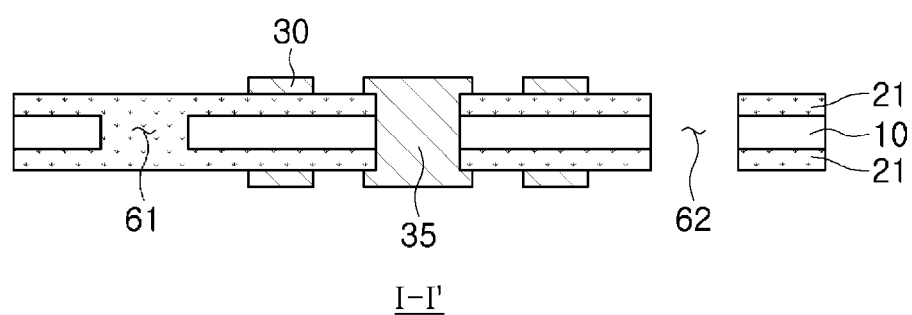
FIG. 7B is a diagram illustrating a cross-section of the printed circuit board of FIG. 7A across the I-I' line.

Referring to FIGS. 7A and 7B, a via 35 may be formed by filling the via hole 65 with a conductive metal and a conductive pattern 30 may be formed on the first insulating material 21.

Filling with a conductive metal and forming the conductive pattern 30 may be performed by a suitable technique such as, for example, electroplating. However, they may not limited thereto.

Figure 8A:
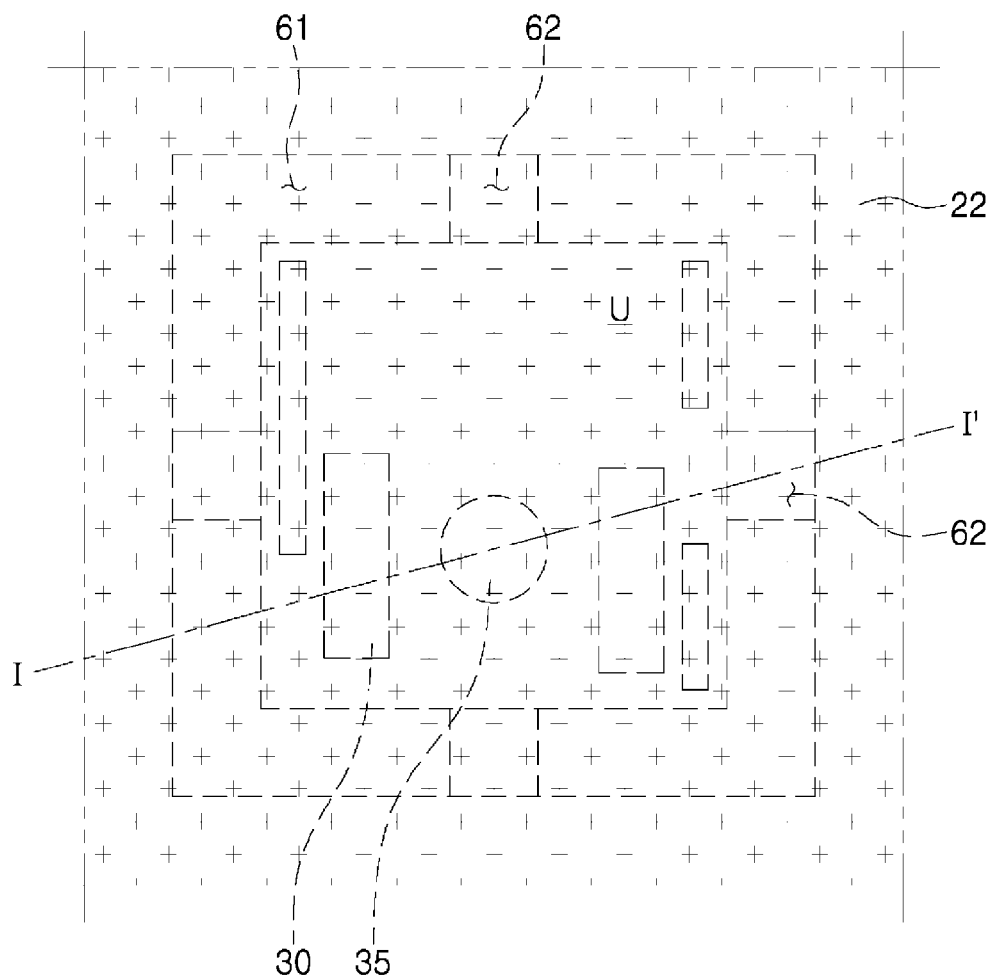
FIG. 8A a sectional diagram illustrating a printed circuit board during an operation of a method of manufacturing a printed circuit board, in accordance with an embodiment.
Figure 8B:
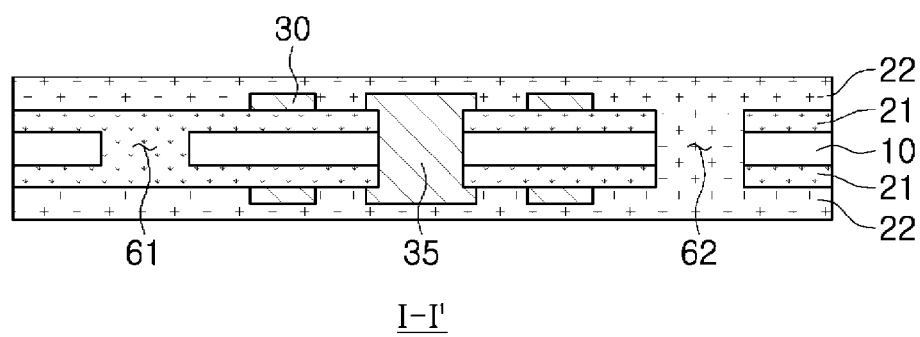
FIG. 8B is a diagram illustrating a cross-section of the printed circuit board of FIG. 8A across the I-I' line.

Referring to FIGS. 8A and 8B, the second insulating material 22 is laminated on the first insulating material 21 on which the conductive pattern 30 is formed. The second hole 62 is filled with the second insulating material 22.

Because the second insulating material 22 is formed on the first insulating material 21 and the second hole 62 is also filled with the second insulating material 22, the second insulating material 22 filled into the second hole 62 may be integrated with the second insulating material 22 laminated on the first insulating material 21.

Glass may not be present on the boundaries BD between the unit printed circuit boards U, but the first insulating material 21 and the second insulating material 22 are filled.

Figure 9A:
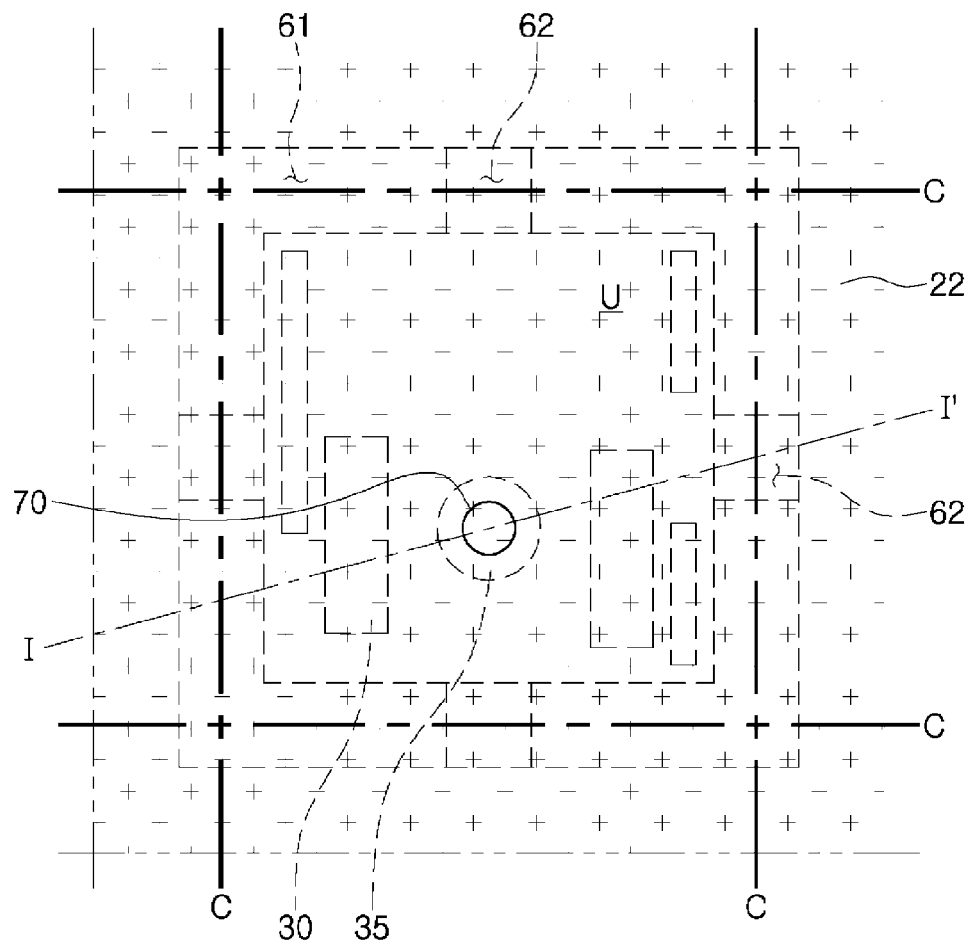
FIG. 9A a sectional diagram illustrating a printed circuit board during an operation of a method of manufacturing a printed circuit board, in accordance with an embodiment.
Figure 9B:
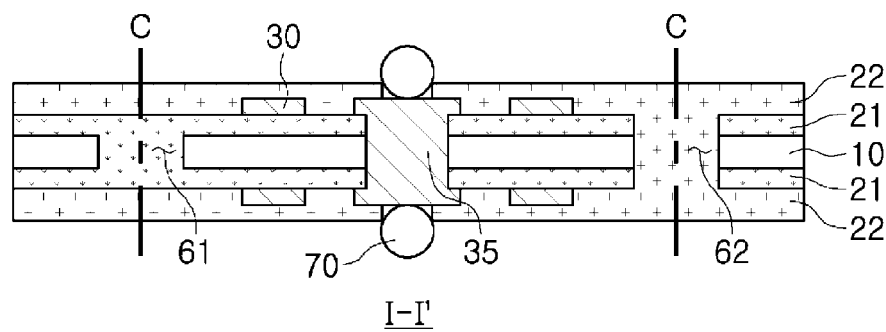
FIG. 9B is a diagram illustrating a cross-section of the printed circuit board of FIG. 9A across the I-I' line.

Referring to FIGS. 9A and 9B, the portion where the first insulating material 21 and the second insulating material 22 are formed may be cut along a cutting line c on the boundaries BD to separate unit printed circuit boards.

A solder bump 70 may be formed on the pad for mounting an electronic component which is exposed prior to the cutting process.

In the cutting process to separate unit printed circuit boards, the glass core 10 is not directly cut, thereby preventing breakage of the glass core 10.

A part of the side surface 10s of the glass core 10 of the printed circuit board is surrounded by the first insulating material 21 and the rest part 10r is surrounded by the second insulating material 22 so that the glass core 10 is completely surrounded by the first insulating material 21 and the second insulating material 22 such that no portion of the glass core 10 is exposed to the outside. It may thus prevent a toast defect of the board.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A printed circuit board having conductive patterns formed in multilayers on an insulating material laminated on both surfaces of a glass core, the printed circuit board comprising:
    a first insulating material disposed on a first surface and a second surface of the glass core; and
    a second insulating material disposed on the first insulating material,
    wherein the first insulating material surrounds a first portion of a side surface of the glass core and the second insulating material surrounds a second portion of the side surface of the glass core, the second portion being a portion of the glass core not surrounded by the first insulating material.

2. The printed circuit board of claim 1, wherein the glass core is disposed inside the first insulating material and the second insulating material, such that no portion of the glass core is exposed to an outside.

3. The printed circuit board of claim 1, wherein the first insulating material surrounding the side surface of the glass core is integrated with the first insulating material disposed on the first surface and the second surface of the glass core.

4. The printed circuit board of claim 1, wherein the second insulating material is integrated with the second insulating material disposed on the first insulating material.

5. The printed circuit board of claim 1, wherein the first insulating material and the second insulating material comprise a resin.

6. The printed circuit board of claim 5, wherein the first insulating material and the second insulating material further comprise a reinforcing material.

7. The printed circuit board of claim 5, wherein the first insulating material is different from the second insulating material.

8. The printed circuit board of claim 1, further comprising a conductive pattern disposed on the first insulating material.

9. A method of manufacturing a printed circuit board, the method comprising:
    forming a first hole along a part of boundaries between unit printed circuit boards having a glass core;

laminating a first insulating material on a first surface and a second surface of the glass core and filling the first hole with the first insulating material;

forming a second hole at a portion where the first hole is not formed in the boundaries between the unit printed circuit boards;

laminating a second insulating material on the first insulating material and filling the second hole with the second insulating material; and cutting a portion where the first insulating material and the second insulating material are formed along the boundaries to form unit printed circuit boards.

10. The method of claim 9, wherein the glass core of each of the unit printed circuit board is formed inside the first insulating material and the second insulating material, such that no portion of the glass core is exposed to an outside.

11. The method of claim 9, wherein the first insulating material filled in the first hole is integrated with the first insulating material laminated on the first surface and the second surface of the glass core.

12. The method of claim 9, wherein the second insulating material filled in the second hole is integrated with the second insulating material laminated on the first insulating material.

13. The method of claim 9, wherein the first insulating material and the second insulating material comprise a resin.

14. The method of claim 13, wherein the first insulating material and the second insulating material further comprise a reinforcing material.

15. The method of claim 9, wherein the first insulating material is different from the second insulating material.

16. The method of claim 9, further comprising forming a conductive pattern on each of the first insulating material and the second insulating material.

17. The method of claim 16, further comprising forming a conducting via passing through the glass core, the first insulating material, and the second insulating material, the conducting via connecting the conductive pattern on the first insulating layer with the conductive pattern on the second insulating layer.

* * * * *